United States Patent [19]

Suzuki et al.

[11] Patent Number: 5,548,829
[45] Date of Patent: Aug. 20, 1996

[54] PLL CIRCUIT HAVING A LOW-PASS PASSIVE FILTER COUPLED TO A VARACTOR DIODE

[75] Inventors: Tamotsu Suzuki; Yoshikazu Shimada, both of Kyoto, Japan

[73] Assignee: Rohm Co., Ltd., Kyoto, Japan

[21] Appl. No.: 350,039

[22] Filed: Nov. 29, 1994

[30] Foreign Application Priority Data

Dec. 1, 1993 [JP] Japan .................................. 5-329652
Dec. 1, 1993 [JP] Japan .................................. 5-329653

[51] Int. Cl.$^6$ ............................................ H04B 1/06
[52] U.S. Cl. ............................ 455/180.3; 455/180.4; 455/191.2; 455/260; 455/142; 455/144; 331/17
[58] Field of Search .................. 455/142–144, 455/180.3, 180.4, 191.2, 260, 265; 331/17

[56] References Cited

U.S. PATENT DOCUMENTS

| | | | |
|---|---|---|---|
| 4,774,480 | 9/1988 | Sato et al. | 331/17 |
| 5,146,187 | 9/1992 | Vandegraaf | 331/17 |
| 5,153,530 | 10/1992 | Takagi et al. | 331/17 |
| 5,220,294 | 6/1993 | Ichikawa | 331/17 |

FOREIGN PATENT DOCUMENTS

| | | | |
|---|---|---|---|
| 0138621 | 12/1978 | Japan | 455/142 |
| 1-65528 | 4/1989 | Japan . | |

OTHER PUBLICATIONS

"Wakaru PLL no Oyo Tekunikku (Applied Techniques of the PLL Circuit)", ed. by S. Takamatsu, Jan. 20, 1988.

*Primary Examiner*—Andrew Faile
*Attorney, Agent, or Firm*—Fay, Sharpe, Beall, Fagan, Minnich & McKee

[57] ABSTRACT

A low-pass passive filter is inserted in the phase locked loop of a voltage-controlled oscillating circuit having a varactor diode. The filter has a first resistor, a capacitor and a second resistor connected in that order and the blocking characteristics of the filter are changed in accordance with a selected value of the second resistor. A push-pull output circuit in which the upstream transistor is connected directly to the supply voltage line receives the signal from a phase comparator circuit (which is indicative of the result of phase comparison) and outputs it to the low-pass passive filter. The low-pass passive filter controls the terminal voltage of the varactor diode in accordance with the terminal voltage of the capacitor and the value of the second resistor is selected depending on the desired blocking characteristics of the filter.

8 Claims, 3 Drawing Sheets

5,548,829

PLL CIRCUIT HAVING A LOW-PASS PASSIVE FILTER COUPLED TO A VARACTOR DIODE

BACKGROUND OF THE INVENTION

1. Technical Field

This invention relates to a phase-locked loop (PLL) circuit, as well as a PLL frequency synthesizer and a radio receiver that use the PLL circuit. More particularly, the invention relates to a PLL frequency synthesizer that is driven on low voltage, that does not use any active filter in the PLL and that still is capable of rapid frequency locking as soon as the current frequency of PLL oscillation shifts to a different value.

2. Background Art

The PLL frequency synthesizes is used as part of a circuit that supplies the output of a PLL circuit to a local oscillator in a radio receiver or a modulating circuit in a radio transmitter and which converts the input signal to a signal of a given frequency which may be an intermediate frequency in the case of the radio receiver. In the PLL frequency synthesizer, the cutoff frequency of the low-pass filter (LPF) which is inserted into the loop of a PLL circuit is related not only to the locking range over which frequencies can be locked by the PLL but also to the response characteristics for the case of a shift in the frequency range, say, from the AM to FM range. Hence, the cutoff frequency of the LPF in the PLL is selected in accordance with the broadcasting station at which the frequency controls have been tuned in. If the frequency channel is changed to a certain station, tracking of the frequency of the signals from that station must be accomplished automatically and as rapidly as possible. To meet this need, the indicial response characteristics in the case where the cutoff frequency of the LPF in the PLL is changed to a different value must also be considered. Generally speaking, the locking range of the PLL becomes narrow as the cutoff frequency of the LPF decreases with respect to the input signal and vice versa.

One of the approaches that have dealt with these problems of the PLL circuit is described in Unexamined Published Japanese Utility Model Application (kokai) Hei 1-65528. A prior art technology that is relevant to the present invention is a circuit that uses a lead-lag filter in the PLL and which is described in "Wakaru PLL no Oyo Tekunikku (Applied Techniques of the PLL Circuit)", ed. by S. Takamatsu, published by Nihon Hoso Shuppankyokai, Jan. 20, 1988.

FIG. 3 shows a prior art PLL frequency synthesizer of the type contemplated by the invention which produces local oscillations in the frequency range from the AM to FM band. The heart of this synthesizer is to change the damping resistance in response to a frequency shift in such a way as to accomplish rapid locking to the selected frequency.

Referring to FIG. 3, numeral 10 designates the PLL frequency synthesizer and numeral 11 is a voltage-controlled oscillating circuit (VCO) containing a varactor diode 11a, the capacitance of which varies in response to the terminal voltage so as to control the frequency of oscillation. Shown by numeral 12 is an integrated phase comparator circuit for PLL control (hereunder abbreviated as "PLL IC") with a built-in programmable divider; numeral 13 is a microprocessor unit (MPU); numeral 14 is a quartz or ceramic oscillator; numeral 15 is an active filter capable of changing the damping time constant; numeral 16 is an integrating circuit composed of a resistor Ri and a capacitor Ci; numeral 17 is the receiving antenna on a radio receiver; numeral 18 is a radio-frequency (RF) amplifier for amplifying the received signal at frequencies in the RF range; and numeral 19 is a mixing circuit for converting the amplified signal to one having an intermediate frequency. In the system shown in FIG. 3, the active filter 15 and the integrating circuit 16 serve as an amplifier and a two-stage LPF in the PLL to change the cutoff frequency or damping characteristics so that the VCO will oscillate with good response at frequencies ranging from the AM to FM band.

PLL IC 12 contains a shaping circuit 21 that receives the output of VCO 11 and shapes its waveform to a pulse signal, a reference frequency oscillating circuit 23, a phase comparator circuit (PC) 24, a charge/discharge pulse generator circuit (charge pumping circuit) 25, and a switching circuit 26. The programmable divider 22 is composed of a programmable counter that counts the number of output pulses from the shaping circuit 21. The reference frequency oscillating circuit 23 is connected to the quartz oscillator 14 and generates a reference clock in accordance with the center frequency of the oscillation by 14. The phase comparator circuit 24 compares the phase of the output from the reference frequency oscillating circuit 23 with that of the output from the programmable divider 22 and produces the output of the comparison and its inverted output. The charge pumping circuit 25 receives pulse signals indicative of these two outputs and supplies the active filter 15 with charging/discharging pulses. The switching circuit 26 receives the signal from the microprocessor unit 13 and turns on and off to change the damping time constant.

The active filter 15 is composed of a resistor R connected to a supply line Vcc, as well as an n-type field-effect transistor (FET) Q, damping resistors R1 and R2 that are connected to the input of transistor Q, and a series feedback circuit that is composed of a resistor R3 and a capacitor C and which acts as a loop filter that feeds the output of transistor Q back to its input.

The PLL frequency synthesizer shown in FIG. 3 operates as follows. In response to an applied frequency selection signal SEL, MPU 13 generates dividing data n and a control signal CS in accordance with the selected frequency. In accordance with the operator-selected frequency, the programmable divider 22 receives the signal of the dividing data n from the MPU 13 and counts n output pulses from the VCO 11, whereupon pulses whose frequency is one nth of the input frequency are generated. As a result, those pulses which have been frequency-divided by n in accordance with the dividing data n are sent out to the phase comparator circuit 24.

The phase comparator circuit 24 compares the phase of the frequency-divided pulses with that of the clock signal having the reference frequency. The pulses that result from the comparison and their inverted pulses are then supplied to the charge pumping circuit 25, which supplies the active filter 15 with ON/OFF pulses of a width that complies with the width of the pulses from the phase comparator circuit 24. As a result, the component of ON/OFF pulses below the cutoff frequency of the active filter 15 is transmitted by the latter and sent out to the integrating circuit 16. The capacitor Ci in the integrating circuit 16 is then supplied with a voltage signal to be applied to the varactor diode 11a. This voltage signal controls the frequency of oscillation of VCO 11 in such a way that the divided frequency that has been produced from the programmable divider 22 is locked to the reference frequency from the reference frequency oscillating circuit 23, whereupon the frequency of oscillation of VCO 11 is locked to a value that is a multiple as determined by the dividing data n. Thus, the frequency of oscillation of VCO 11 can be set in accordance with the dividing data n received by the programmable divider 22.

Suppose here the case of selecting an FM frequency, in which the frequency of oscillation of the VCO 11 is on the order of megahertz. Since the center frequency of PLL oscillation shifts to a different region as a result of the change from the AM to FM band, high-speed frequency locking cannot be accomplished unless the damping factor of indicial response is reduced to a sufficiently low level. To meet this need, a large value of the damping resistance is selected for the FM range and the output of the charge pumping circuit 25 is supplied to the active filter 15 via the resistor R1. Consider next the case of selecting an AM frequency, in which the frequency of oscillation of VCO 11 is on the order of kilohertz. To achieve rapid frequency locking, the damping factor of PLL indicial response must be increased (namely, the damping resistance must be reduced). To meet this need, the output of the charge pumping circuit 25 is supplied to the active filter 15 via a circuit in which resistor R1 of the greater value is connected parallel to resistor R2 of the smaller value. Hence, if an AM frequency is selected, the switching circuit 26 turns on in response to control signal CS from the MPU 13 and the two resistors R1 and R2 are connected parallel to each other.

In FIG. 3, the active filter 15 is shown as a component externally connected to PLL IC 12. In most cases, however, the transistor portion of the active filter 15 and the associated peripheral circuit are internal parts of PLL IC 12 and other ICs. If the frequency of oscillation of the VCO is to be changed by controlling the voltage applied to the varactor diode, high voltage control is necessary and, hence, an active filter capable of amplification is used customarily.

In the case described above the charge pumping circuit 25 and the active filter 15 are included in the PLL. If all of these components are assembled in an IC, the efficiency of circuit integration is impaired by the inclusion of the active filter. If the active filter 15 is externally connected to the PLL IC, the number of circuit components is one too many. Further, the active filter is typically provided with a bias voltage from the supply line via the resistor and, hence, the maximum voltage that controls the VCO is lower than the supply line voltage and the maximum voltage for oscillation control is easily limited. As a further problem, the current flowing from the charge pump 25 to the integrating circuit 16 via the active filter 15 will prolong the cycle time of capacitor Ci and the speed of tracking a selected frequency is slowed down. This problem is particularly serious in the case where the PLL circuit under discussion is applied to circuits of a type to be driven on low voltage. With circuits of the low-voltage drive type, the range of control voltage becomes narrow and the frequency control range is limited accordingly. As a result, the tracking efficiency of the PLL over a wide range of frequencies from the AM to FM band is reduced and the range of frequencies that can be tracked becomes accordingly narrow.

SUMMARY OF THE INVENTION

The present invention has been accomplished under these circumstances and has as an object providing a PLL circuit that is driven on low voltage and which is capable of frequency locking over a wide range of frequencies without using an active filter in the phase-locked loop.

Another object of the invention is to provide a PLL frequency synthesizer that is capable of implementing a PLL circuit of the low voltage drive type without using an active filter in the PLL.

A further object of the invention is to provide a radio receiver of the low voltage drive type that includes a PLL frequency synthesizer that is capable of frequency selection even at low voltage.

To attain these objects, the PLL circuit, PLL frequency synthesizer and radio receiver of the present invention have the following components in common: a voltage-controlled oscillating circuit that has a varactor diode and the frequency of oscillation of which varies in accordance with the terminal voltage of said varactor diode; a phase comparator circuit that compares the phase of either an input signal from a reference signal oscillator or an externally supplied input signal with the phase of an output signal from said voltage-controlled oscillating circuit; a push-pull output circuit that has the upstream transistor connected directly to a supply line and which, in response to a signal from said phase comparator circuit that is indicative of the result of the comparison, allows a current to flow out of said supply line to the output terminal and thence sink to the ground; and a low-pass passive filter that has a series circuit provided between said output terminal and said ground, with a first resistor, a capacitor and a second resistor connected in that order, that generates a signal for the terminal voltage of said varactor diode in accordance with the terminal voltage of said capacitor, and the blocking characteristics of said filter being changed by selecting a value of said second resistor.

According to the invention, the filter in the PLL of the VCO having a varactor diode is not an active filter but a low-pass passive filter having a series circuit in which a first resistor, a capacitor and a second resistor are connected in that order and the blocking characteristics of this low-pass filter are changed in accordance with a selected value of the second resistor. The invention also includes a push-pull output circuit in which the upstream transistor is connected directly to the supply voltage line and which receives the signal from the phase comparator circuit, which is indicative of the result of phase comparison, and outputs it to the low-pass passive filter. By so doing, the invention is capable of changing the terminal voltage of the capacitor over a wide range from the ground level up to a value near the potential of the supply line. Hence, even in a low-voltage drive mode, the terminal voltage of the varactor diode can be varied widely from the ground level up to a value near the potential of the supply line regardless of the blocking characteristics that are selected by the filter.

Consequently, the VCO can be oscillated at a wide range of frequencies from low to high levels and the time to PLL locking can be sufficiently shortened so that high-speed tracking of various frequencies is accomplished if the invention is applied to a tuning circuit. Compared to a conventional PLL circuit of the type that has an active filter built in as an IC component, the elimination of an active filter from the PLL circuit of the invention contributes to a higher degree of integration of the various functional devices in the overall circuit. Further, the control voltage can be selected at a sufficiently large value to permit the circuit to be driven on low voltage.

DESCRIPTION OF THE PREFERRED EMBODIMENTS

Figure 1:
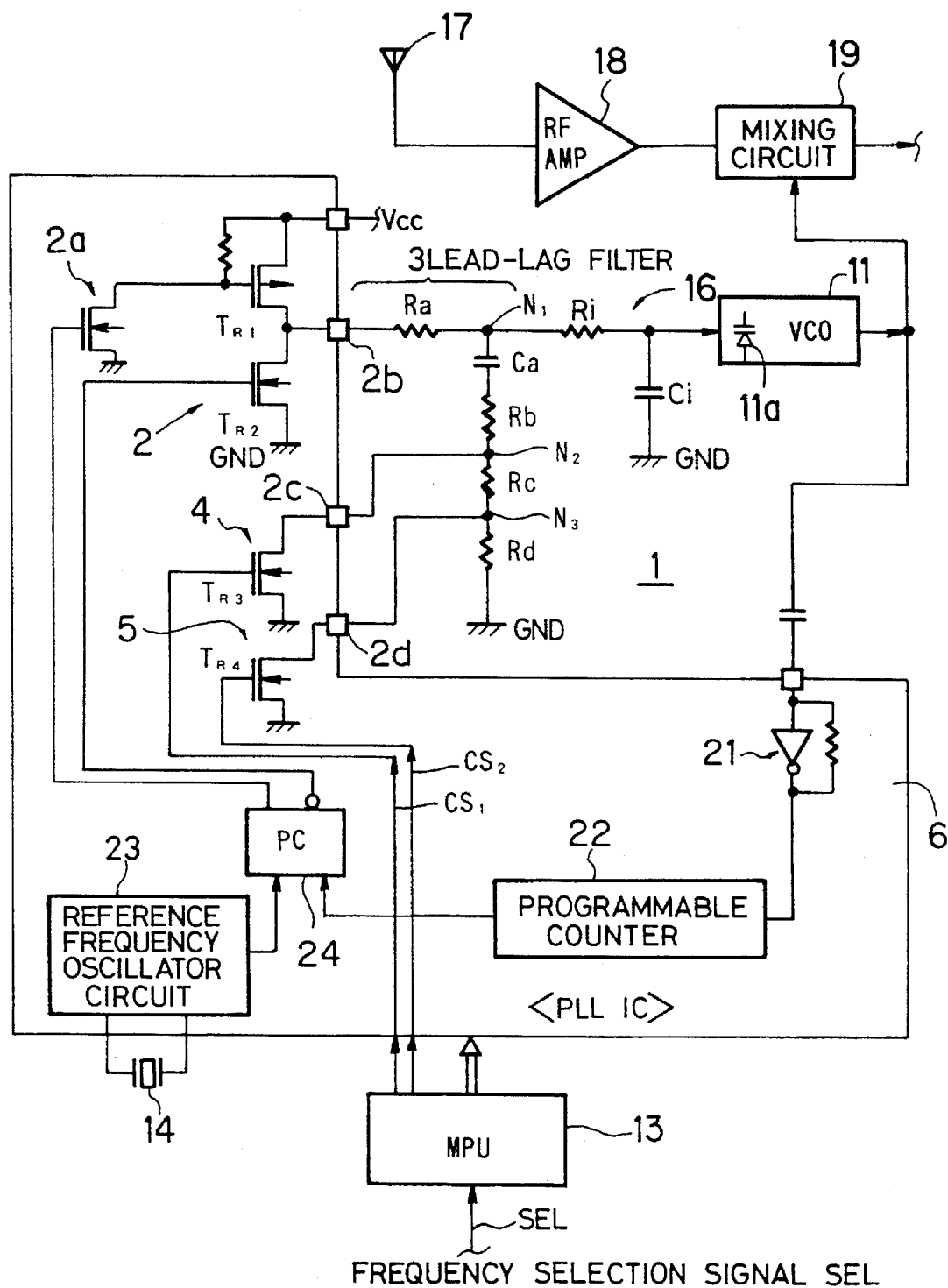
FIG. 1 is a block diagram showing the essential part of a PLL frequency synthesizer according to an embodiment of the invention as it relates to a PLL circuit.
Figure 3:
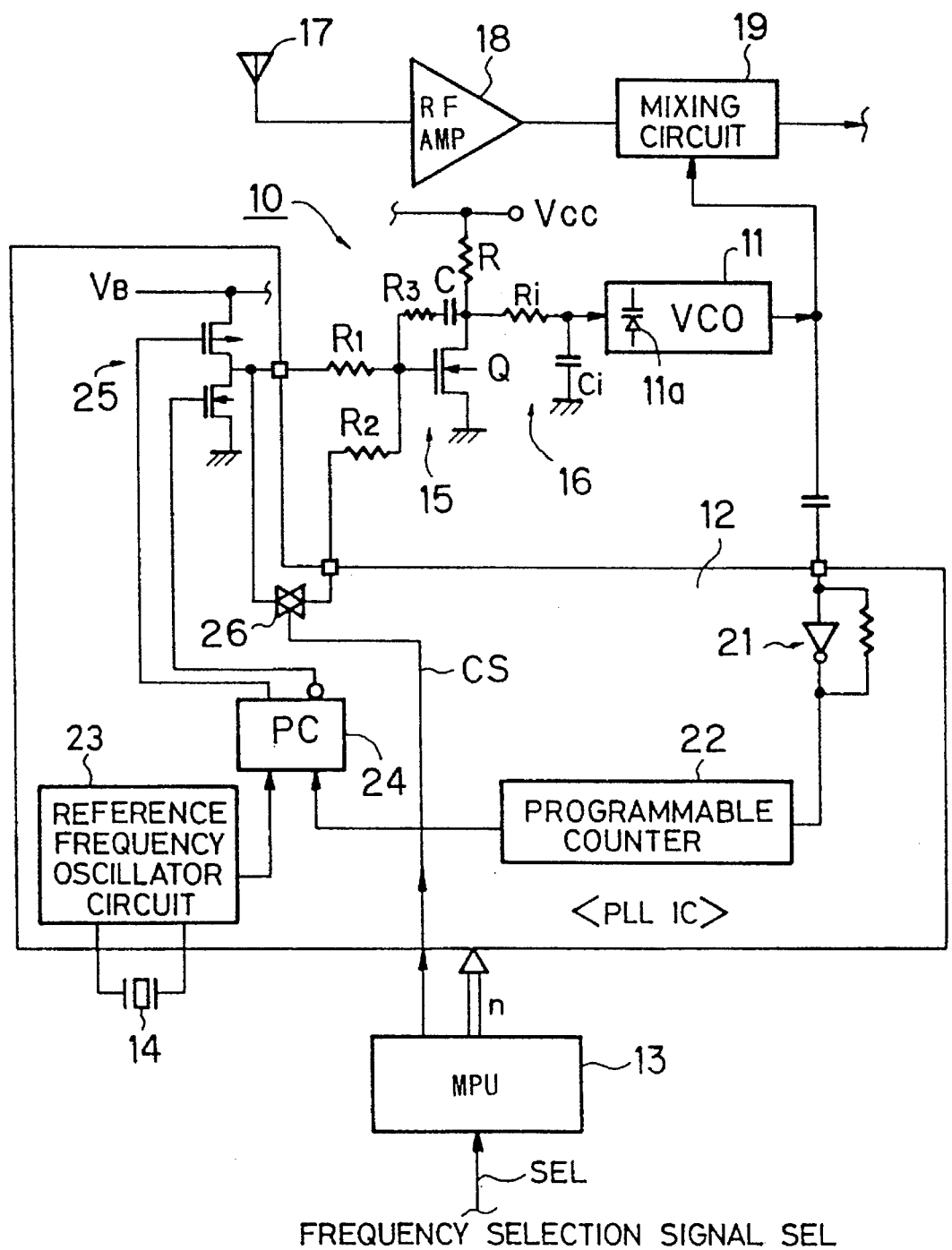
FIG. 3 is a block diagram showing the essential part of a prior art PLL frequency synthesizer as it uses a PLL circuit.

The PLL frequency synthesizer shown in FIG. 1 differs from what is shown in FIG. 3 in several ways but the principal differences are the following three: i) the charge pumping circuit 25 is replaced by a charge pumping circuit 2 that is composed of a push-pull transistor circuit in which the upstream transistor is connected directly to the supply line Vcc; ii) the active filter 15 is replaced by a lead-lag filter 3; and iii) MPU 13 outputs one extra switching signal. In FIG. 1, the components which are the same as those used in FIG. 3 are identified by like numerals and will not be described below.

Turning back to FIG. 1, numeral 1 refers to the PLL frequency synthesizer, numeral 6 is the PLL IC in the synthesizer, numeral 2 is the charge pumping circuit in the PLL IC 6, numeral 3 is the lead-lag filter, and numerals 4 and 5 are damping resistance switching circuits.

The charge pumping circuit 2 is composed of a CMOS push-pull circuit in which the upstream p-type field-effect transistor (FET) TR1 has its source connected to the supply line Vcc whereas the downstream n-type FET TR2 has its source connected to the ground (GND) line. The gate of FET TR1 receives the pulses from the phase comparator, indicative of the result of phase comparison, via a level converting circuit 2a, whereas the gate of FET TR2 receives the same pulses after they have been inverted by means of an invertor (not shown). The drains of both transistors TR1 and TR2 are each connected to the output terminal 2b, which is connected to the lead-lag filter 3 which composes an L-type low-pass passive filter.

The lead-lag filter 3 is composed of a series circuit including a resistor Ra, series circuit consisting of a capacitor Ca and resistors Rb, Rc and Rd. The resistor Ra, capacitor Ca, and resistors Rb, Rc and Rd are connected in that order between the output terminal 2b and the ground GND. A portion of the series circuit consisting of capacitor Ca and resistors Rb, Rc and Rd provides a branch of the filter 3 to the ground. The voltage at the point of junction N1 between the resistor Ra and the capacitor Ca is applied to the integrating circuit 16. The point of junction N2 between the resistor Rb which is downstream of capacitor Ca and the resistor Rc is connected to the drain of an n-type FET TR3 in the switching circuit 4 via terminal 2c of the PLL IC 6. The point of junction N3 between resistors Rc and Rd is connected to the drain of an n-type FET TR4 in the switching circuit 5 via the terminal 2d of the PLL IC 6. The sources of TR3 and TR4 are connected to the ground line GND and control signals CS1 and CS2 from the MPU 13 are applied to the gates of the respective transistors to turn them on. As a result, the points of junction N3 and N4 are grounded via the sources of the respective transistors TR3 and TR4.

Suppose here that MPU 13 selects the FM band in response to the frequency selection signal SEL which is supplied externally for selecting either FM or AM as the frequency band to be received. If either one of the control signals CS1 and CS2 already exists, their generation is stopped and if none of these signals exist, MPU 13 will not permit them to be generated. If the FM band is selected and when the signal SEL selects the lower-frequency band to be received in the FM range, MPU 13 generates control signal CS2, which turns on the switching circuit 5. If MPU 13 receives a signal SEL that selects the AM band, it generates control signal CS1 which turns on the switching circuit 4. If the control signal CS2 already exists in this case, the MPU 13 stops the generation of that signal. Selection signal SEL either consists of an AM/FM switching signal and a signal that selects the desired frequency after AM/FM switching is done or a signal that selects a certain of the stations assigned in the AM and FM bands.

In order for the MPU 13 to generate control signals and dividing data in response to the selection signal SEL, the data that generate such signals may be read from a memory or a lookup table in accordance with specific conditions. A detailed description of the procedure for generating the signals is omitted since it can be implemented by common technologies.

The PLL frequency synthesizer shown in FIG. 1 is operated in the following manner. Consider first the case of selecting an FM frequency, in which high-speed frequency locking cannot be accomplished unless the damping factor is made sufficiently small. To meet this need, the damping resistance is set at a large value. Then, both switching circuits 4 and 5 will turn off without receiving control signals SC1 and SC2 from the MPU 13. Consequently, the lead-lag filter 3 will be grounded via the high resistance offered by the series circuit consisting of resistors Rb, Rc and Rd. This causes small damping to be applied when VCO 11 experiences a frequency shift from the AM to FM band. As a result, for tuning in the FM band, the frequency of oscillation of VCO 11 can be rapidly locked to the selected value that is determined in accordance with the dividing data n that is sent from the MPU 13 to the programmable divider 22.

If, after the FM and selection, the lower frequency range of the band is selected, MPU 13 generates control signal SC2 which turns on the switching circuit 5 so that the junction point N3 is grounded to insure better tracking performance. As a result, the damping time constant decreases and the cutoff frequency of the lead-lag filter 3 shifts to a higher range than in the case described in the preceding paragraph. The lead-lag filter 3 is grounded to a portion of the series circuit consisting of resistors Rb and Rc. Thus, the lead-lag filter 3 is grounded via a lower resistance than in the case described in the preceding paragraph and moderate damping is applied when the VCO 11 experiences a frequency shift to the lower frequency in the FM band, whereby the frequency of oscillation of VCO 11 can be locked to the selected low FM frequency at a medium speed.

If the AM band is selected, MPU 13 generates control signal SC1 which turns on the switching circuit 4 so that the junction point N2 is grounded. As a result, the lead-lag filter 3 is grounded via resistor Rb. In other words, the filter is grounded with a lower resistance and the damping time constant becomes even smaller than in the case just described above, whereby the cutoff frequency of the lead-lag filter 3 makes a shift to an even higher range. As a result, greater damping is applied when the VCO 11 experiences a frequency shift from the FM to AM band and the frequency of oscillation of VCO 11 can be locked to the selected AM frequency at a sufficiently high speed.

In the embodiment described above, the charge pumping circuit 2 is composed of a CMOS push-pull circuit in which the source of the upstream FET TR1 is connected to the supply line Vcc, whereas the source of the downstream FET TR2 is grounded. In addition, the control voltage is drawn from the capacitor Ca in the L-type lead-lag filter 3. Because of these arrangements, the output voltage of the lead-lag filter 3 can be raised near to the potential of the supply line Vcc without using an active filter and no matter which blocking characteristics are selected and, consequently, the frequency of oscillation of the VCO 11 having the varactor diode 11a can be controlled over a wide range. As a further advantage, the elimination of an active filter contributes to a reduction in the number of circuit components that have to be connected externally.

Figure 2:
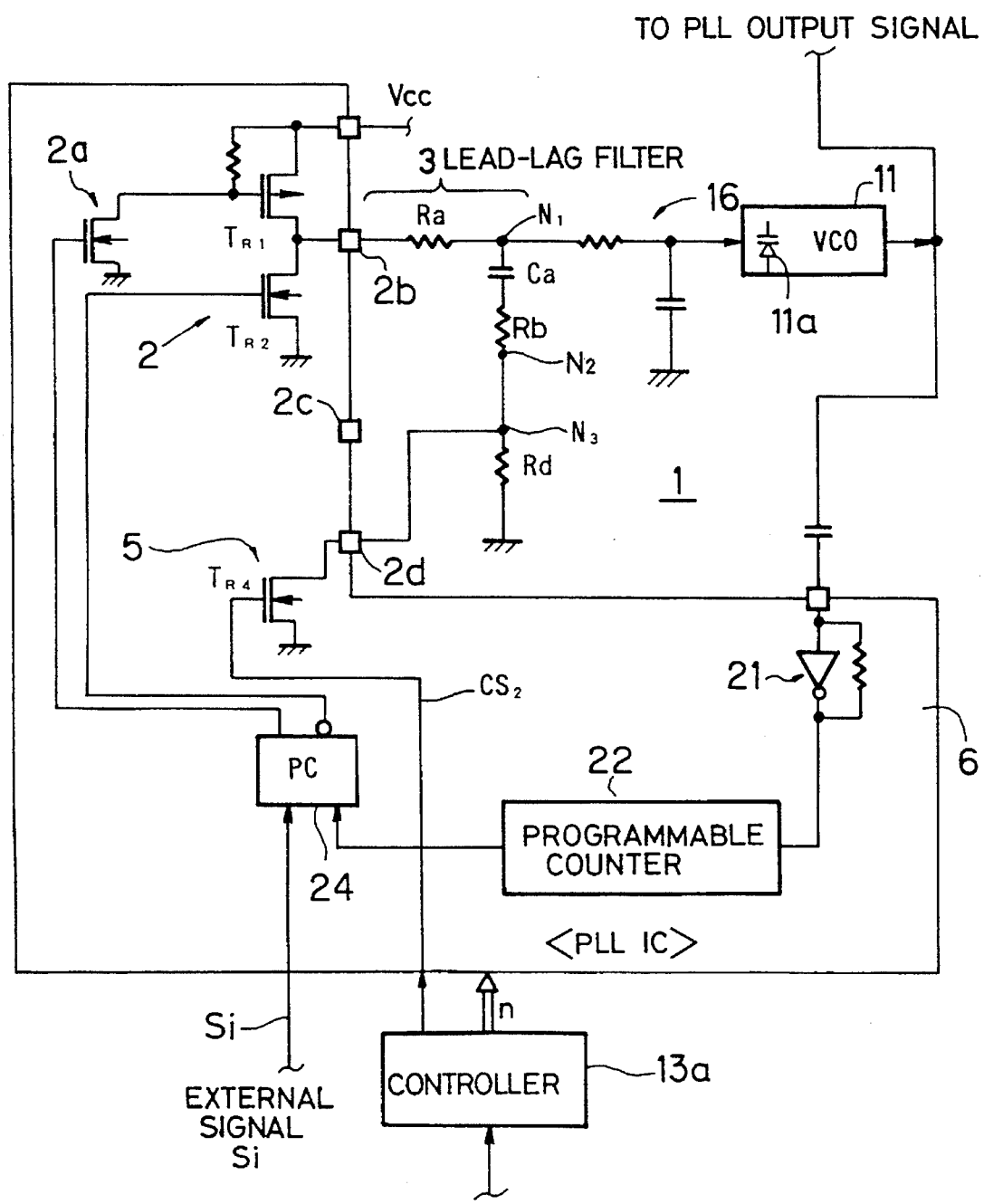
FIG. 2 is a block diagram showing another embodiment of the invention as it relates to a PLL circuit.

FIG. 2 is a block diagram showing a PLL frequency synthesizer according to the second embodiment of the invention, which is the same as the embodiment shown in FIG. 1 except for the following points: the reference frequency oscillating circuit 23 which generates a reference clock, the switching circuit 4 and the resistor Rc are eliminated; and MPU 13 is replaced by a controller 13a which similarly sends out dividing data n to the programmable divider 22 while sending control signal CS2 to the switching circuit 5. In the second embodiment, the phase comparator circuit 24 is externally supplied with an input signal Si that serves as a reference for phase comparison and according to which the signal for oscillation of VCO 11 will be locked to the frequency that is determined by the dividing data n.

The operation of the PLL frequency synthesizer shown in FIG. 2 is essentially the same as that of the first embodiment and need not be described here.

While the concept and implementation of the invention have been described on the foregoing pages, it should of course by understood that the low-pass passive filter is not limited to the L-type used in the preferred embodiments. The charge pumping circuit and the switching circuits 4 and 5 use field-effect transistors (FET) but, needless to say, they may be replaced by bipolar transistors, in which the collector and emitter correspond to the drain and source electrode terminals, respectively, of FET. It should also be noted that from a design viewpoint, the p- and n-type transistors used in the embodiments may be replaced by n- and p-types, respectively, depending upon the line voltage and drive signals.

In the two preferred embodiments, the resistors downstream of the capacitor in the branch of the lead-lag filter to the ground are connected in series but, needless to say, those resistors may be connected in parallel and the blocking characteristics that are determined by the time constant of the lead-lag filter having that arrangement may be selected.

What is claimed is:

1. A phase-locked loop circuit comprising:
   a voltage-controlled oscillating circuit that has a varactor diode and a frequency of oscillation which varies in accordance with a terminal voltage of said varactor diode;
   a phase comparator circuit that compares a phase of either an output signal from a reference signal oscillator or an externally supplied input signal with a phase of an output signal from said voltage-controlled oscillating circuit;
   a push-pull output circuit that has an upstream transistor connected directly to a supply line and which, in response to a signal from said phase comparator circuit that is indicative of a result of the comparison, allows a current to flow out of said supply line to an output terminal and then sink to ground; and
   a low-pass passive filter that has a series circuit provided between said output terminal and said ground, with a first resistor, a capacitor, a second resistor and a third resistor connected in that order, that generates a signal for the terminal voltage of said varactor diode in accordance with a terminal voltage of said capacitor, and wherein blocking characteristics of said filter are changed by selective inclusion of said second and third resistors.

2. A phase-locked loop circuit according to claim 1 which further includes said reference signal oscillator and a switching circuit that is connected to the point of junction between said second resistor and said third resistor, said phase comparator circuit comparing the phase of the output signal from said reference signal oscillator with the phase of an output signal from said voltage-controlled oscillating circuit, and wherein the blocking characteristics of said filter are altered by turning on said switching circuit.

3. A phase-locked loop circuit according to claim 2 wherein said switching circuit is connected between said ground and the point of junction between said second and third resistors.

4. A phase-locked loop circuit according to claim 3 which further includes a programmable divider provided between the input of said phase comparator circuit and the output of said voltage-controlled oscillating circuit, an integrating circuit provided between the output of said low-pass passive filter and said voltage-controlled oscillating circuit, and a controller and wherein the voltage of said integrating circuit is sent to the terminal of said varactor diode whereas said controller sends a dividing signal to said programmable divider and, depending on an applied external frequency selection signal, said controller also sends a control signal that turns on said switching circuit.

5. A phase-locked loop frequency synthesizer comprising:
   a voltage-controlled oscillating circuit that has a varactor diode and a frequency of oscillation which varies in accordance with a terminal voltage of said varactor diode;
   a reference frequency oscillator;
   a phase comparator circuit that compares a phase of an output signal from said reference signal oscillator with a phase of an output signal from said voltage-controlled oscillating circuit;
   a push-pull output circuit that has an upstream transistor connected directly to a supply line and which, in response to a signal from said phase comparator circuit that is indicative of a result of the comparison, allows a current to flow out of said supply line to sink to ground; and
   a low-pass passive filter that has a series circuit provided between said output terminal and said ground, with a first resistor, a capacitor, a second resistor and a third resistor connected in that order, that generates a signal for the terminal voltage of said varactor diode in accordance with a terminal voltage of said capacitor, and wherein blocking characteristics of said filter are changed by selective inclusion of said second and third resistors, and wherein the selective inclusion is determined by a control signal.

6. A phase-locked loop frequency synthesizer according to claim 5 which further includes a programmable divider provided between the input of said phase comparator circuit and the output of said voltage-controlled oscillating circuit, an integrating circuit provided between the output of said low-pass passive filter and said voltage-controlled oscillating circuit, a microprocessor and a switching circuit and wherein the voltage of said integrating circuit is sent to the terminal of said varactor diode whereas said microprocessor sends a dividing signal to said programmable divider and, depending on an applied external frequency selection signal, said microprocessor also sends said control signal.

7. A radio receiver comprising:

a voltage-controlled oscillating circuit that has a varactor diode and a frequency of oscillation which varies in accordance with a terminal voltage of said varactor diode;

a reference frequency oscillator;

a phase comparator circuit that compares a phase of an output signal from said reference signal oscillator with a phase of an output signal from said voltage-controlled oscillating circuit;

a push-pull output circuit that has an upstream transistor connected directly to a supply line and which, in response to a signal from said phase comparator circuit that is indicative of a result of the comparison, allows a current to flow out of said supply line to an output terminal and then sink to ground;

a low-pass passive filter that has a series circuit provided between said output terminal and said ground, with a first resistor, a capacitor, a second resistor and a third resistor connected in that order, that generates a signal for the terminal voltage of said varactor diode in accordance with a terminal voltage of said capacitor, and wherein blocking characteristics of said filter are changed by selective inclusion of said second and third resistors; and a mixing circuit for receiving said output signal from said voltage-controlled oscillating circuit and a high-frequency amplified reception signal, and wherein the selective inclusion is determined by a control signal.

8. A radio receiver according to claim 7 which further includes a programmable divider provided between the input of said phase comparator circuit and the output of said voltage-controlled oscillating circuit, an integrating circuit provided between the output of said low-pass passive filter and said voltage-controlled oscillating circuit, a microprocessor and a switching circuit and wherein the voltage of said integrating circuit is sent to the terminal of said varactor diode whereas said microprocessor sends a dividing signal to said programmable divider and, depending on an applied external frequency selection signal, said microprocessor also sends said control signal.

* * * * *